United States Patent
Wyant et al.

(10) Patent No.: US 8,883,567 B2
(45) Date of Patent: Nov. 11, 2014

(54) PROCESS OF MAKING A STACKED SEMICONDUCTOR PACKAGE HAVING A CLIP

(75) Inventors: Michael Todd Wyant, Dallas, TX (US); Patricia Sabran Conde, Pasig (PH); Vikas Gupta, Dallas, TX (US); Rajiv Dunne, Murphy, TX (US); Emerson Mamaril Enipin, Angeles (PH)

(73) Assignee: Texas Instruments Incorporated, Dallas, TX (US)

( * ) Notice: Subject to any disclaimer, the term of this patent is extended or adjusted under 35 U.S.C. 154(b) by 338 days.

(21) Appl. No.: 13/431,758

(22) Filed: Mar. 27, 2012

(65) Prior Publication Data
US 2013/0256852 A1    Oct. 3, 2013

(51) Int. Cl.
*H01L 21/00* (2006.01)
*H01L 23/495* (2006.01)
*H05K 5/02* (2006.01)

(52) U.S. Cl.
CPC .... *H01L 23/49524* (2013.01); *H01L 23/49555* (2013.01)
USPC ........... 438/119; 438/123; 257/676; 257/692; 257/783; 257/786; 361/813

(58) Field of Classification Search
CPC ................. H01L 23/3107; H01L 23/49541; H01L 23/495; H01L 25/0657; H01L 23/28; H01L 23/49524; H01L 23/49555; H01L 24/37; H01L 24/40; H01L 24/84
See application file for complete search history.

(56) References Cited

U.S. PATENT DOCUMENTS

| | | | |
|---|---|---|---|
| 7,095,113 B2 * | 8/2006 | Xiaochun et al. | 257/725 |
| 7,238,551 B2 * | 7/2007 | Kasem et al. | 438/123 |
| 8,564,110 B2 * | 10/2013 | Xue et al. | 257/676 |
| 2006/0108671 A1 * | 5/2006 | Kasem et al. | 257/676 |
| 2006/0214290 A1 * | 9/2006 | Xiaochun et al. | 257/728 |
| 2009/0121331 A1 * | 5/2009 | Cruz | 257/676 |
| 2012/0228696 A1 * | 9/2012 | Carpenter et al. | 257/329 |
| 2012/0235289 A1 * | 9/2012 | Xue et al. | 257/676 |
| 2013/0113114 A1 * | 5/2013 | Hosseini et al. | 257/777 |
| 2014/0061884 A1 * | 3/2014 | Carpenter et al. | 257/676 |

* cited by examiner

*Primary Examiner* — Alonzo Chambliss
(74) *Attorney, Agent, or Firm* — Steven A. Shaw; Frederick J. Telecky, Jr.

(57) ABSTRACT

A method of making a stacked semiconductor package having at least a leadframe, a first die mounted above and soldered to the lead frame and a first clip mounted above and soldered to the first die. The method includes positioning the leadframe, first die and first clip in a vertically stacked relationship and nonsolderingly locking the first clip in laterally nondisplaceble relationship with the leadframe. A stacked semiconductor package and an intermediate product produced in making a stacked semiconductor package are also disclosed.

17 Claims, 4 Drawing Sheets

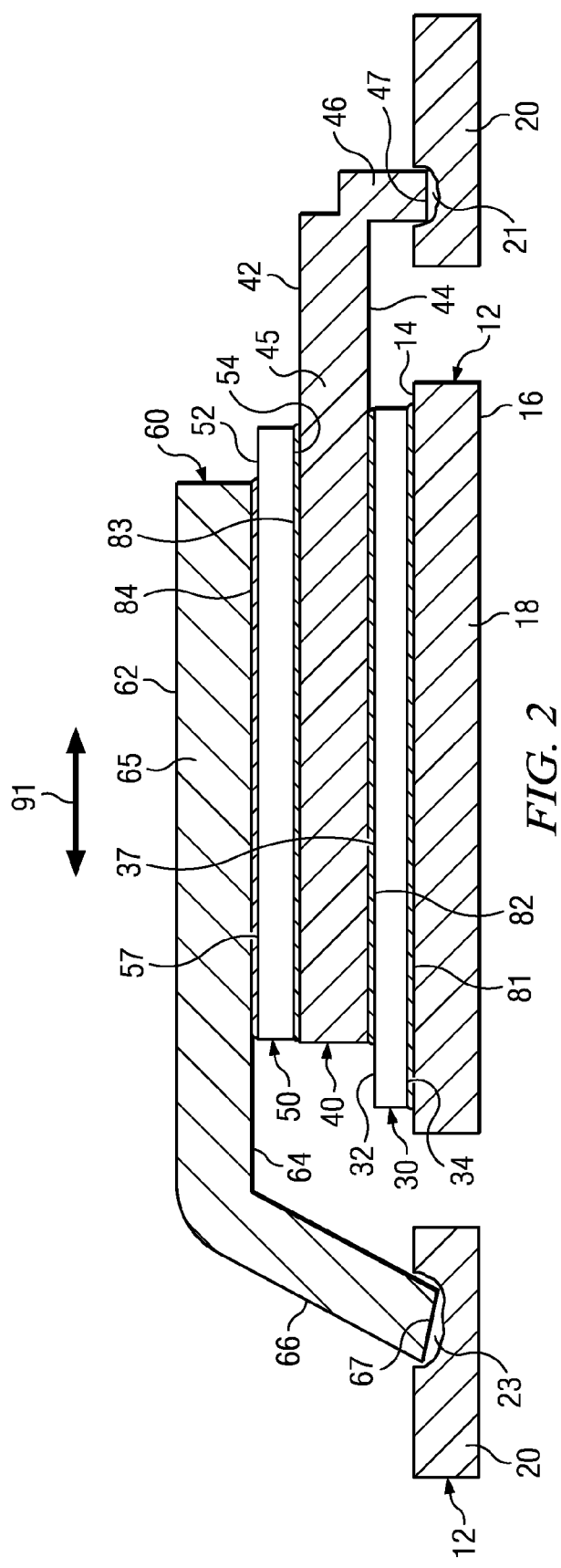
FIG. 2
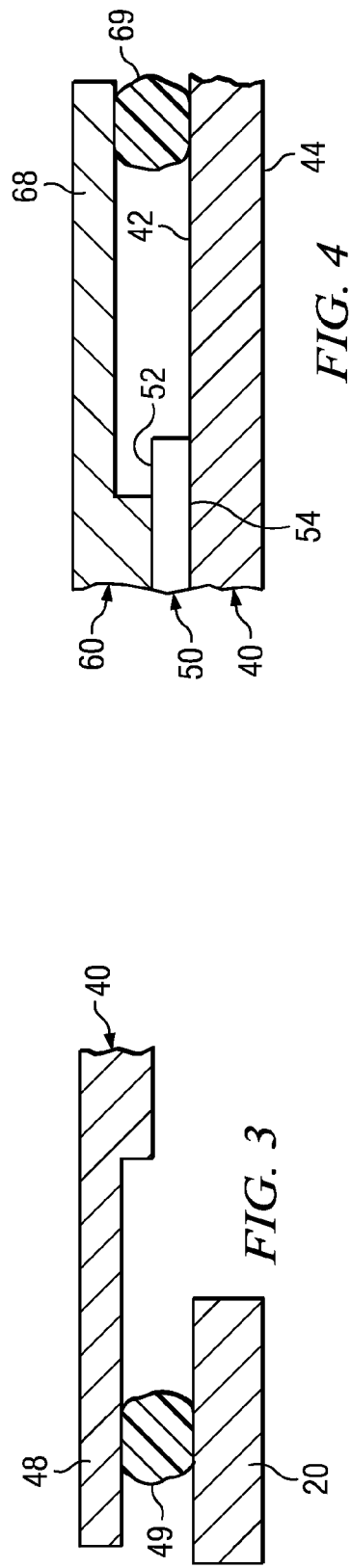
FIG. 4
FIG. 3

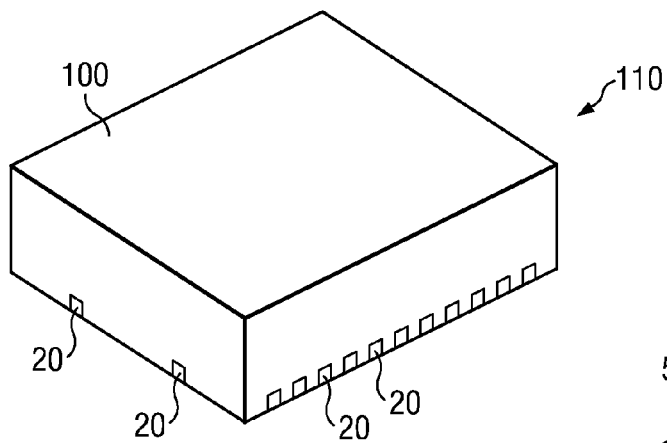

FIG. 6

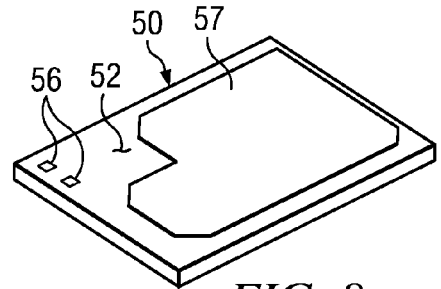

FIG. 8

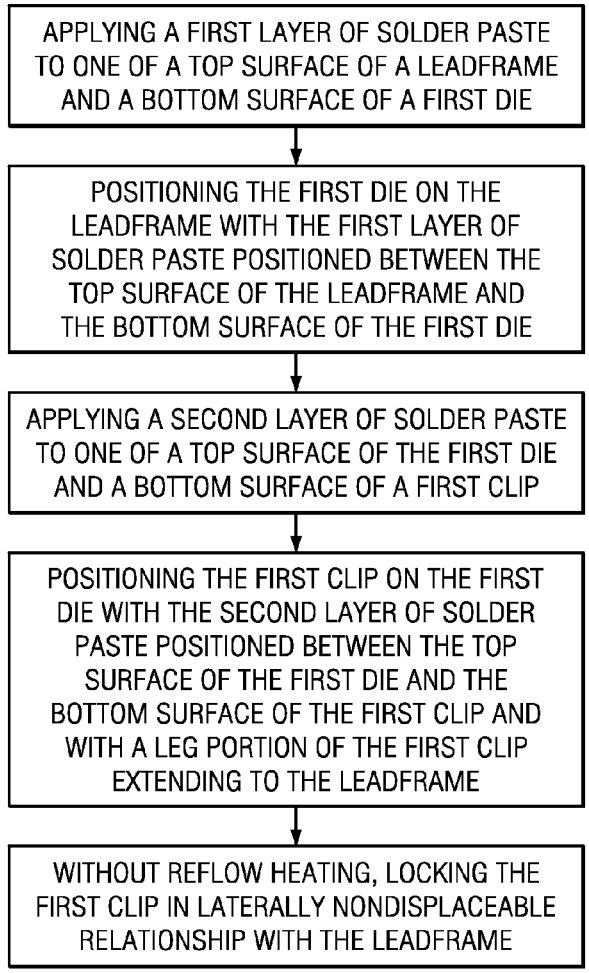

| APPLYING A FIRST LAYER OF SOLDER PASTE TO ONE OF A TOP SURFACE OF A LEADFRAME AND A BOTTOM SURFACE OF A FIRST DIE |

↓

| POSITIONING THE FIRST DIE ON THE LEADFRAME WITH THE FIRST LAYER OF SOLDER PASTE POSITIONED BETWEEN THE TOP SURFACE OF THE LEADFRAME AND THE BOTTOM SURFACE OF THE FIRST DIE |

↓

| APPLYING A SECOND LAYER OF SOLDER PASTE TO ONE OF A TOP SURFACE OF THE FIRST DIE AND A BOTTOM SURFACE OF A FIRST CLIP |

↓

| POSITIONING THE FIRST CLIP ON THE FIRST DIE WITH THE SECOND LAYER OF SOLDER PASTE POSITIONED BETWEEN THE TOP SURFACE OF THE FIRST DIE AND THE BOTTOM SURFACE OF THE FIRST CLIP AND WITH A LEG PORTION OF THE FIRST CLIP EXTENDING TO THE LEADFRAME |

↓

| WITHOUT REFLOW HEATING, LOCKING THE FIRST CLIP IN LATERALLY NONDISPLACEABLE RELATIONSHIP WITH THE LEADFRAME |

FIG. 7

PROCESS OF MAKING A STACKED SEMICONDUCTOR PACKAGE HAVING A CLIP

BACKGROUND

Multi-chip modules (MCM's) are integrated circuit packages in which multiple semiconductor dies are packaged on the same substrate. MCM's traditionally have dies mounted side by side on a substrate. However, more recently MCM's have been developed in which semiconductor dies are stacked vertically. Such vertically stacked dies have a smaller footprint than conventional MCM's and are often used in applications such as cell phones and tablet computers in which chip space is at a premium. The stacked dies are typically encapsulated in protective epoxy, such as by transfer molding.

BRIEF DESCRIPTION OF THE DRAWINGS

FIG. 2 is a cross sectional elevation view of the stacked semiconductor package subassembly of FIG. 1.

FIG. 3 is a cross sectional view of a portion of the stacked semiconductor package subassembly of FIG. 1.

FIG. 4 is a perspective view of the stacked semiconductor package subassembly of FIG. 1 after reflow heating, wire bond connection, encapsulation and singulation thereof (shown partially in phantom).

FIG. 6 is a perspective view of a stacked semiconductor package, fully encapsulated and singulated, which shows the entire encapsulation layer.

FIG. 7 is a flow chart of a method of making a stacked semiconductor package.

FIG. 8 is a perspective view of a semiconductor die that forms a part of the stacked semiconductor package of FIG. 6.

DETAILED DESCRIPTION

In conventional flat MCM's, dies are initially positioned side by side and held in position on a substrate by an underlying layer of solder paste. The solder paste is sufficiently adhesive to prevent the dies from moving when the assembly is transferred to a reflow oven. The leadframe and dies are then heated in the reflow oven which causes the solder paste to liquefy and bond to the surfaces of the substrate and dies. When the molten solder cools, the dies and substrate are firmly attached to each other.

Applicants have discovered a problem in the production of stacked semiconductor packages in which multiple stacked dies are connected to a leadframe by clips and in which the dies and clips are connected with solder. To produce such stacked die packages, the dies and clips are initially stacked on top one another on a leadframe with a layer of solder paste positioned between the first die and leadframe and between each die and clip. Probably due to the height of the die/clip stack, the adhesive property of the solder paste is not sufficient to prevent lateral displacement of the dies and clips relative to the leadframe and to one another. This relative lateral displacement typically occurs when the leadframe/die/clip assembly is moved to a reflow oven. Such relative lateral movement between leadframe dies and clips often causes defects in the resulting stacked die package. Applicants have also discovered that such lateral displacement and associated defects can be prevented by a mechanical locking feature.

Figure 5:
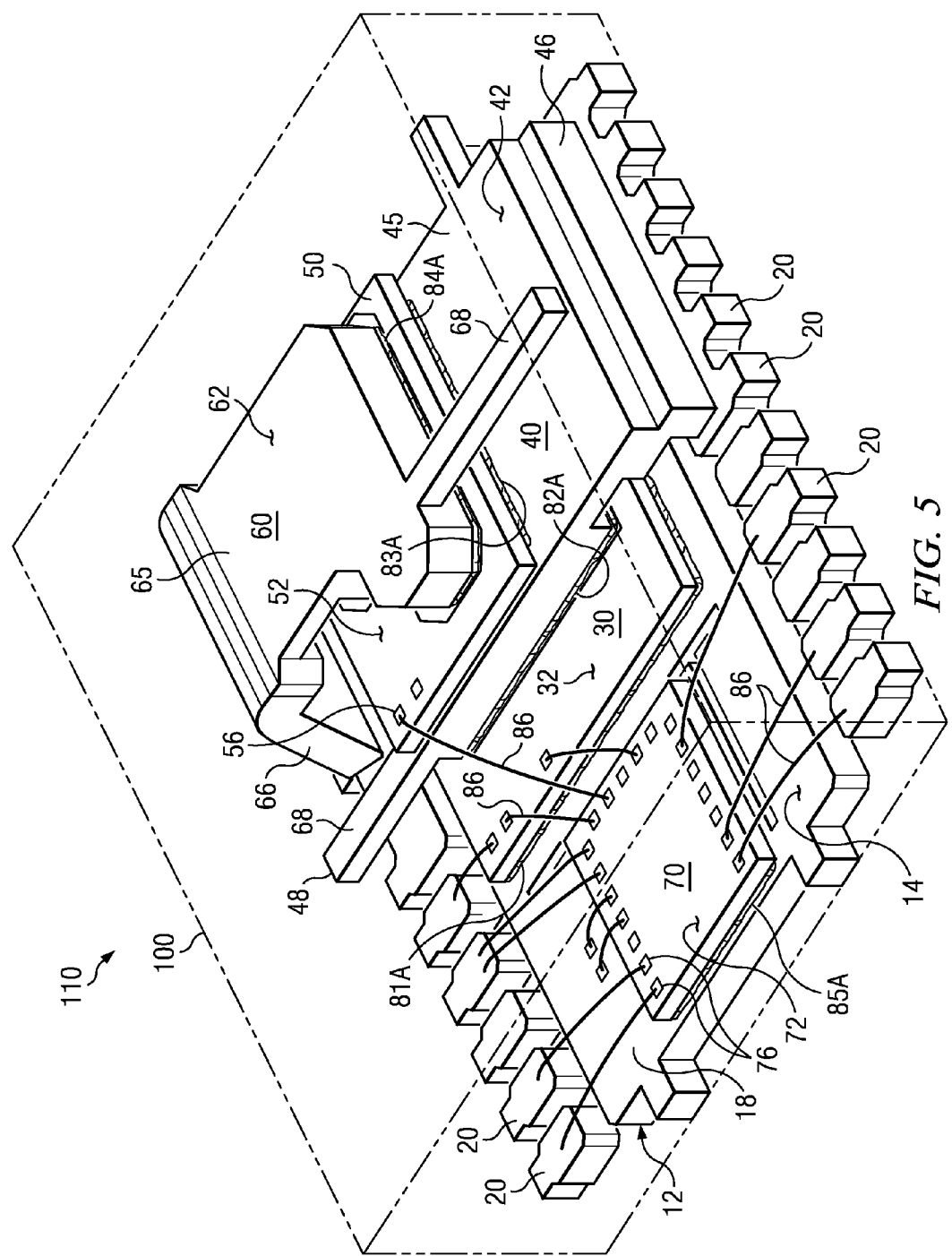
FIG. 5 is a perspective view of a stacked semiconductor package, fully encapsulated and singulated, but showing only a portion of the encapsulation layer in dashed lines.

FIGS. 1-6 and 8, in general, show various features of a stacked semiconductor package 110 and show how it is produced. As best shown in FIG. 5, the stacked semiconductor package 110 may include a leadframe 12 and a first die 30 that is stacked on the leadframe 12 and attached to the leadframe 12 by a first solder layer 81A. The package 110 may also include a first clip 40 that is stacked on the first die 30 and attached to the first die with a second layer of solder 82A. The first clip 40 is mechanically locked against lateral displacement with respect to the leadframe 12 by structure other than solder. The semiconductor package 110 may include other die(s) and clip(s) stacked on top the first die 30 and clip 40 in which the clip(s) is/are each locked in place by a nonsolder structure as well as by a layer of solder. The stacked semiconductor package 110 may also include an encapsulation layer 100.

In describing the various features of a stacked semiconductor package 110, applicants have used terms of positional/directional reference such as up, down, bottom, above, and below, which are sometimes used in reference to an orientation with respect to the surface of the earth. Such terms are not used in that sense in this application. Rather, terms such as up, down, etc. are used only in a relative sense to indicate the position of an object or surface with respect to other objects or surfaces in a structure which initially is oriented as shown in the drawings. As used in this sense the "top" of a car would still be referred to as the "top" of the car, even when the car is subsequently positioned upside down in a ditch.

Figure 1:
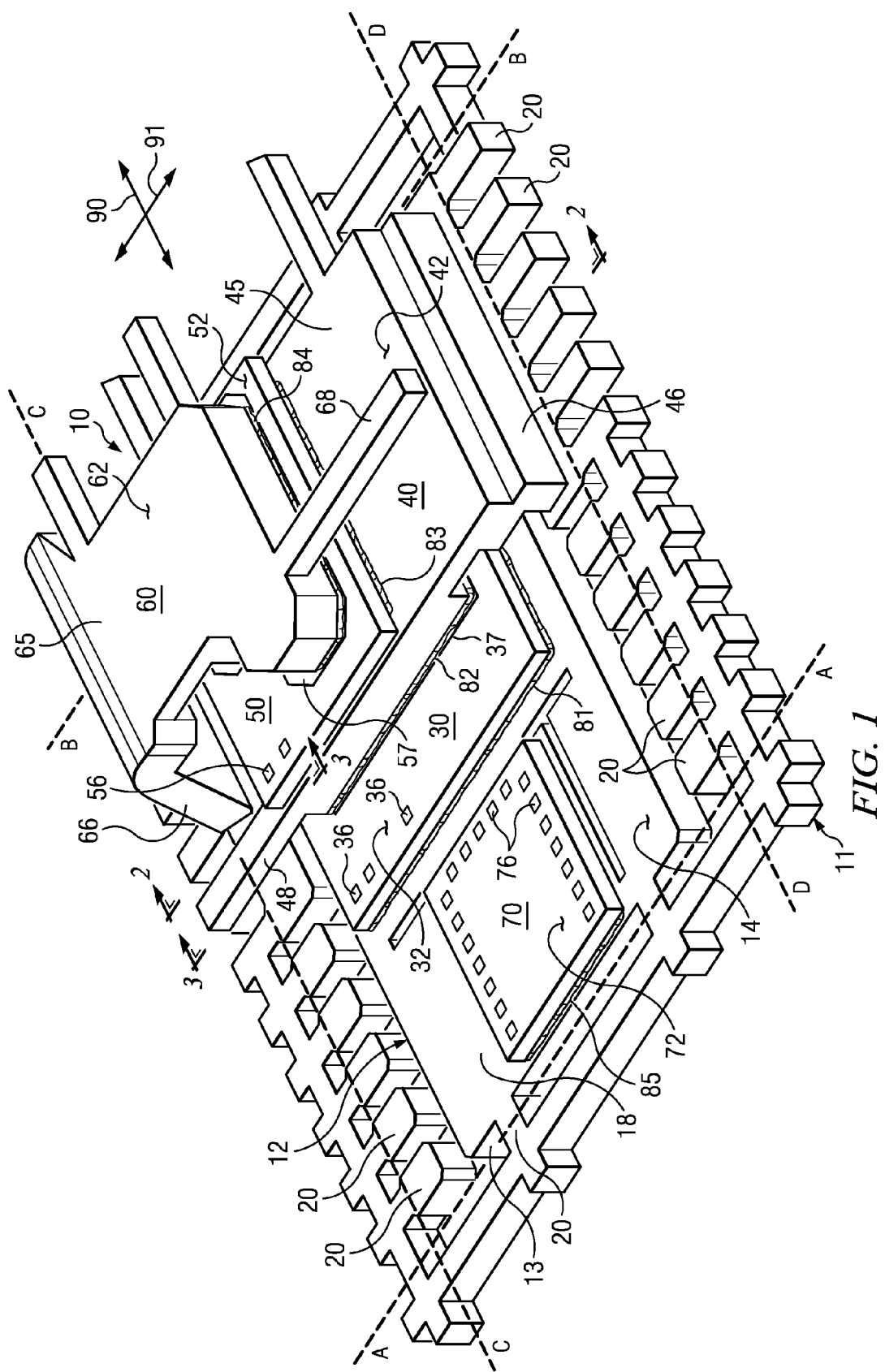
FIG. 1 is a perspective view of a stacked semiconductor package subassembly.

Having described the stacked semiconductor package 110 generally above, further details of its construction and methods of production will now be described. FIG. 1 illustrates a stacked semiconductor package subassembly 10 which includes a leadframe 12 that is a portion of a larger leadframe sheet 11. For illustrative purposes, the only portion of the leadframe sheet 11 shown in FIG. 1 is the portion attached about the periphery of leadframe 12. During later singulation of the stacked semiconductor package subassembly 10, the portion of the leadframe sheet 11 positioned outwardly of saw streets AA, BB, CC, and DD is separated from subassembly 10. The leadframe 12 includes a front portion 13, a top surface 14 and a bottom surface 16 (FIG. 2). The leadframe 12 includes a centrally positioned die pad 18 and a plurality of peripherally positioned leads 20. A first die 30 is mounted on the die pad 18 of the leadframe. The first die may be relatively flat and rectangular in shape and includes a top surface 32 and bottom surface 34 (FIG. 2). The first die 30 has a number of contact pads 36 on the top surface 32 thereof including a large contact pad 37 beneath first clip 40.

The first clip 40 has a top surface 42 and a bottom surface 44 (FIG. 2). The first clip has a body portion 45 which is adapted to be positioned on top of the first die 30 and further includes a first leg portion 46 which extends downwardly from the body portion 45 and engages a plurality of leads 20. In some embodiments, first clip 40 includes a tie bar 48 which projects outwardly from one lateral side of the first clip 40.

The second die 50 (FIGS. 1, 2 and 8), which may be relatively flat and rectangular, is mounted on the top surface 42 of the first clip 40. The second die 50 includes a top surface 52, bottom surface 54 and a plurality of contact pads 56 located in the top surface 52, including a large contact pad 57 positioned below a second clip 60.

A second clip 60 having a top surface 62 and a bottom surface 64 (FIG. 2) has a body portion 65 positioned on top second die 50. The second clip 60 also includes a leg portion 66 integrally formed with the body portion 65 and projecting downwardly therefrom that engages a plurality of peripherally positioned leads 20. In some embodiments, a tie bar portion 68 projects laterally outwardly from a side portion of the second clip 60.

A third die 70 may be mounted on the leadframe die pad 18 at a position thereon immediately forward of first die 30. The third die 70 has a top surface 72, a bottom surface 74 (FIG. 1), and a plurality of contact pads 76.

The leadframe 12, first die 30, first clip 40, second die 50, second clip 60 and third die 70 are held in place in the final stacked die semiconductor package 110, FIG. 5, by a plurality of solder layers. In order to provide the solder layers, a number of layers of solder paste are applied to the various components as will now be described.

Prior to mounting first die 30 on die pad 18, a first layer of solder paste 81 is applied to the top surface of the die pad 18. The solder paste has a mildly adhesive property and thus tends to hold the first die 30 in position on the die pad 18. Rather than placing the first layer of solder paste 81 on the die pad 18, it will, of course, be understood that the layer of solder paste could be applied to the bottom surface 34 of the first die 30 instead. This will also be understood with respect to the description of the remaining layers of solder paste, dies and clips. Next a second layer of solder paste 82 is applied to the top surface 32 of the first die 30 and the first clip 40 is mounted thereon. Next a third layer of solder paste 83 is applied to the top surface 42 of first clip 40 and the second die 50 is then mounted on the first clip 40. A fourth layer of solder paste 84 is then applied to the top surface 52 of second die 50 and the second clip 60 is positioned on top the second die 50. Next, a fifth layer of solder paste 85 is applied to the die pad 18 forward of the first die 30. The third die 70 is thereafter mounted on the centrally positioned die pad 18, sandwiching the fifth layer of solder paste 85 between it and the die pad 18. In addition to the layers of solder paste 81-85 which are sandwiched between dies and adjacent leadframe and clips, other portions of the various components may also be coated with solder paste to provide mechanical and/or electrical connection of components. For example the leg portions of the clips 40, 60 and the leads 20 which they engage may have a layer of solder paste (not shown) applied therebetween.

In order for the layers of solder paste 81-85 to bind with adjacent surfaces, the solder paste must be heated to free flow temperature and subsequently cooled. As noted previously, applicants have discovered that when the stacked semiconductor package subassembly 10 is moved to a reflow oven, the adhesive properties of the solder paste layers 81 through 85 are not sufficient to prevent moderate shifting of the various components laterally, i.e., in forward and rearward directions 90 and/or side to side directions 91. Such lateral shifting may cause defects in the subsequently produced stacked semiconductor package 110. Such defects may include insufficient electrical contact between the surfaces of certain components or short circuits between areas of components which improperly come into contact.

Applicants have developed techniques to prevent such lateral shifting of components. These techniques are implemented before the subassembly 10 is moved to a reflow oven. One technique for preventing lateral shifting is best illustrated in FIG. 2. According to this technique the first and second clips 40, 60 are held in laterally fixed relationship by abutting engagement between surface portions thereof and surface portions of a set of leads 20. In FIG. 2, each of the several leads 20 which are engaged by the first clip leg portion 46 is provided with a half etch 21. These half etches 21 may be positioned in longitudinal alignment such that an end projection 47 of the leg portion 46 is received within a more or less continuous half etch groove or trench. Thus, the recessed surface of the half etch 21 co-acts with the surface of the end projection 47 to form a mechanical lock that positively prevents lateral displacement of the first clip 40 relative to the leadframe 12. Stabilizing the clip 40 in this manner also helps to laterally stabilize the first die 30 on which it is mounted. The second clip 60 may be stabilized in the same manner. An end projection 67 of the second clip leg portion 66 is received in the series of half etches 23 which are provided in another set of leads 20. Thus second clip 60 is prevented from shifting laterally relative to the leadframe 12 which also laterally stabilizes the second die 50 upon which it is mounted. Again, the abutting surfaces of the recesses formed by the half etching 23 and the surface portion of the end projection 67 abut one another to prevent lateral shifting.

FIGS. 3 and 4 illustrate another technique for preventing lateral shifting of the first clip 40. In some embodiments, the first clip 40 has a laterally projecting tie bar 48 integrally formed therewith. The tie bar 48 is typically used during pick and place operations for mounting and otherwise handling of the clip 40. In this embodiment, the tie bar 48 is also used to laterally stabilize the clip 40. The tie bar 48 extends out over the leads 20 such that an end portion of the tie bar 48 is positioned directly above one of the leads 20. UV-curing epoxy 49 is applied between the lead 20 and the end of tie bar 48. Next, the UV-curing epoxy 49 is exposed to UV light which causes the epoxy to cure and rigidly attach the tie bar 48 to the lead 20. This attachment forms another type of mechanical bond for holding the first clip 40 in laterally stable position on top the first die 32. As illustrated in FIG. 4, a tie bar 68 on the second clip 60 extends out over the first clip 40. Thus, UV-curable epoxy 69 positioned between tie bar 68 and the top surface 42 of first clip 40 can be exposed to UV light to cure the epoxy 69 and adhere tie bar 68 to first clip 40. Because of the mechanical lock formed by epoxy 69, second clip 60 is prevented from laterally shifting.

The mechanical locks formed by abutting engagement of surfaces or by UV-curable epoxy attachment of surfaces described above may be used singly or in combination to laterally stabilize the first and second clips 40, 60 and the first and second dies 30, 50. It will of course be appreciated that these same clip stabilizing techniques may be used in die stacks containing only one clip or any number of clips.

Next, the stabilized stacked semiconductor package assembly 10, along with the other identical subassemblies on the leadframe sheet 11, is moved to a reflow oven (not shown) where the entire leadframe sheet 11 and attached components are heated to reflow temperature, e.g., between about 100° C. and 250° C. for a period of about 8 minutes to 25 minutes. The heating causes the solder in the first, second, third, fourth, and fifth solder paste layers 81 through 85 to liquefy and bond with adjacent surfaces of the dies and clips. The structure coming out of the reflow oven is thus generally the same as the structure of the subassembly 10 that entered the reflow oven except that the solder paste layers 81-85 have now become solder layers 81A, 82A, 83A, 84A, 85A. Next, as illustrated by FIG. 5, contact pads 36, 56 and 76 on the three dies are attached to one another and/or to leads 20 by bond wires 86. The technique of wire bonding is well known in the art and will thus not be further described herein. Next, the leadframe sheet 11, which includes leadframe 12, FIG. 1, is moved to a transfer mold. In the transfer mold the lead frame sheet 11, including the leadframe 12 and associated clips and dies, is covered with encapsulation material 100. The encapsulation material 100 is indicated by dashed lines in FIG. 4. Next, this encapsulated assembly is singulated along die streets, shown at AA, BB, CC and DD in FIG. 1, to provide a plurality of identical stacked semiconductor packages 110 having a plurality of exposed leads 20, FIG. 6.

It will be appreciated by those skilled in the art that the leadframe 12, dies 30, 50, 70 and clips 40, 50 may be constructed from various materials. In one exemplary and nonlimiting embodiment each die top has a surface coating of nickel/gold compound and each clip is made of Copper. The lead frame may be formed from a sheet of Copper. The solder paste may be indium lead.

While illustrative embodiments of a stacked semiconductor package and methods of making a stacked semiconductor package have been described in detail herein, it is to be understood that the inventive concepts set forth in this disclosure may be otherwise variously embodied and employed. The appended claims are intended to be construed to include such variations except insofar as limited by the prior art.

What is claimed is:

1. A method of making a stacked semiconductor package having at least a leadframe, a first die mounted above and soldered to the lead frame and a first clip mounted above and soldered to the first die comprising:
    applying a first layer of solder paste to one of a top surface of the leadframe and a bottom surface of the first die;
    positioning the first die on the leadframe with the first layer of solder paste sandwiched between the top surface of the leadframe and the bottom surface of the first die;
    applying a second layer of solder paste to one of a top surface of the first die and a bottom surface of the first clip;
    positioning the first clip on the first die with the second layer of solder paste positioned between the top surface of the first die and the bottom surface of the first clip and with a leg portion of the first clip extending to the leadframe;
    nonsolderingly locking the first clip in laterally nondisplaceble relationship with the leadframe;
    applying a third layer of solder paste to one of a top surface of the first clip and a bottom surface of a second die;
    positioning the second die on the first clip with the third layer of solder paste positioned between the top surface of the first clip and a bottom surface of the second die;
    applying a fourth layer of solder paste to one of a top surface of the second die and a bottom surface of a second clip;
    positioning the second clip on the second die with the fourth layer of solder paste positioned between the top surface of the second die and the bottom surface of the second clip and with a leg portion of the second clip extending to the leadframe; and
    nonsolderingly locking the second clip in laterally nondisplaceble relationship with the leadframe.

2. The method of claim 1 comprising:
    applying a fifth layer of solder paste to one of a top surface of the leadframe a bottom surface of a third die; and
    positioning the third die on the leadframe with the fifth layer of solder paste positioned between the top surface of the leadframe and the bottom surface of the third die.

3. The method of claim 2 comprising:
    wire bond connecting contact pads on the third die with the leadframe;
    heating the leadframe; the first, second and third dies; and the first and second clips and all of the layers of solder paste in a reflow oven;
    encapsulating the first second and third dies and the first and second clips in encapsulation compound; and
    singulating said leadframe and associated encapsulation compound positioned thereabove from adjacent portions of a leadframe sheet and encapsulation compound.

4. The method of claim 1 comprising:
    reflow heating the first and second layers of solder paste to solderingly attach the leadframe to the first die and the first die to the first clip.

5. The method of claim 1 wherein said nonsolderingly locking the first clip in laterally nondisplaceble relationship with the leadframe comprises positioning a surface portion of said leg portion of said first clip in abutting relationship with a surface portion of said leadframe.

6. The method of claim 5 wherein positioning a surface portion of said leg portion of said first clip in abutting relationship with a surface portion of said leadframe comprises placing a projection on one of said first clip and said leadframe into a recess on the other of said first clip and said leadframe.

7. The method of claim 1 wherein said nonsolderingly locking the first clip in laterally nondisplaceble relationship with the leadframe comprises:
    applying UV-curable epoxy between a portion of the first clip and an adjacent portion of the leadframe and directing a UV light source onto the UV-curable epoxy.

8. The method of claim 7 wherein said applying UV-curable epoxy between a portion of the first clip and an adjacent portion of the leadframe comprises applying UV-curable epoxy between a tie bar portion of the first clip and an adjacent portion of the leadframe.

9. An intermediate product for use in the production of a stacked semiconductor package comprising:
    a leadframe;
    a first die stacked on said leadframe with a first layer of solder paste positioned therebetween;
    a first clip stacked on said first die with a second layer of solder paste positioned therebetween, wherein said first clip is nonsolderingly locked against lateral displacement with respect to said leadframe;
    a second die stacked on said first clip with a third layer of solder paste positioned therebetween; and
    a second clip stacked on said second die with a fourth layer of solder paste positioned therebetween, wherein said second clip is nonsolderingly locked against lateral displacement with respect to said leadframe.

10. The intermediate product of claim 9 comprising:
    a third die stacked on said leadframe with a fifth layer of solder paste positioned therebetween.

11. The intermediate product of claim 9 wherein said first clip is nonsolderingly locked against lateral displacement with respect to said leadframe by abutting surfaces on said first clip and said leadframe.

12. The intermediate product of claim 9 wherein said first clip is nonsolderingly locked against lateral displacement with respect to said leadframe by UV-curable epoxy positioned between adjacent surface portions of said first clip and said leadframe.

13. A stacked semiconductor package comprising:
    a leadframe;
    a first die stacked on said leadframe and attached thereto by a first solder layer positioned therebetween;
    a first clip stacked on said first die and attached thereto with a second layer of solder positioned therebetween, wherein said first clip is nonsolderingly locked against lateral displacement with respect to said leadframe;
    a second die stacked on said first clip and attached thereto by a third solder layer positioned therebetween; and a second clip stacked on said second die and attached thereto with a fourth layer of solder positioned therebetween, wherein said second clip is also nonsolderingly locked against lateral displacement with respect to said leadframe.

14. The stacked semiconductor package of claim 13 wherein said clips is nonsolderingly locked against lateral displacement with respect to said leadframe by abutting surfaces on said clips and said leadframe.

15. The stacked semiconductor package of claim 14 wherein said abutting surfaces on said clips and said leadframe comprise a projecting surface on one of said leadframe and said clips and a recessed surface on the other of said leadframe and said clips.

16. The stacked semiconductor package of claim 13 wherein said clips is nonsolderingly locked against lateral displacement with respect to said leadframe by UV-curable epoxy positioned between adjacent surface portions of said first clip and said leadframe.

17. The stacked semiconductor package of claim 16 wherein said adjacent surface portions of said first clip and said leadframe comprise a tie bar portion of said first clip and a portion of the leadframe adjacent to said tie bar portion of said first clip.

* * * * *